(12) United States Patent
Venugopal et al.

(10) Patent No.: US 7,230,856 B1
(45) Date of Patent: Jun. 12, 2007

(54) HIGH-SPEED MULTIPLEXER LATCH

(75) Inventors: Rajesh Venugopal, Nashua, NH (US); Greg J. Landry, Merrimack, NH (US); Tao Peng, Nashua, NH (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/259,342

(22) Filed: Oct. 24, 2005

Related U.S. Application Data

(60) Provisional application No. 60/639,429, filed on Dec. 22, 2004.

(51) Int. Cl.
*G11C 7/00* (2006.01)
(52) U.S. Cl. ............ 365/189.02; 365/189.05; 365/203; 326/86; 327/407
(58) Field of Classification Search ........... 365/189.02, 365/189.05, 203; 326/86; 327/407
See application file for complete search history.

(56) References Cited

U.S. PATENT DOCUMENTS

| | | | |
|---|---|---|---|
| 5,650,971 A * | 7/1997 | Longway et al. ........ | 365/207 |
| 6,028,448 A | 2/2000 | Landry | |
| 6,501,696 B1 | 12/2002 | Mnich et al. | |
| 6,707,741 B1 | 3/2004 | Mnich et al. | |
| 6,943,589 B2 * | 9/2005 | Dobberphul ............ | 326/121 |

OTHER PUBLICATIONS

Cypress Semiconductor Corporation, "FLEx36™ 3.3V 32K/64K/128K/256K x36 Synchronous Dual-Port RAM", Data Sheet, 29 pages, Document # 38-06070 Rev. *E, Revised Mar. 7, 2005.
Cypress Semiconductor Corporation, "FLEx36™ 3.3V 32K/64K/128K/256K x36 Synchronous Dual-Port RAM", Data Sheet, 31 pages, Document #38-06070 Rev. *G, Revised Aug. 15, 2005.

* cited by examiner

*Primary Examiner*—Hoai V. Ho
(74) *Attorney, Agent, or Firm*—Blakely Sokoloff Taylor & Zafman LLP

(57) ABSTRACT

Embodiments of a high-speed multiplexer latch are described. The multiplexer latch may include a multiplexer and a latch coupled to each other at a first node and a second node. The multiplexer latch may further include an inverter having an input and an output. The input of the inverter is also coupled to the latch at the second node and the output of the inverter is coupled to a data output terminal. The multiplexer latch may further include a bypass circuit coupled to the latch at the first node and the data output terminal.

14 Claims, 4 Drawing Sheets

-- Prior Art --

HIGH-SPEED MULTIPLEXER LATCH

REFERENCE TO RELATED APPLICATION

This application claims the benefit of U.S. Provisional Application No. 60/639,429, filed on Dec. 22, 2004.

TECHNICAL FIELD

The present invention relates generally to integrated circuits (ICs), and more particularly, to multiplexer (MUX) latches.

BACKGROUND

Latch circuits, such as MUX latches, are widely used in various electronic products, such as memory devices. For instance, latch circuits may be used at memory outputs to hold data between cycles. This allows the memory cells to be disabled to save power. Moreover, latch circuits may also be used with precharge logic to speed up the access time of memory devices.

A conventional MUX latch is shown in FIG. 1. The conventional MUX latch 100 is used in a memory device. The data output from a core of the memory includes two sets of signals, data (dat0–datn) and their complements (dat_b0–dat_bn). The number of signals is determined by the number of memory banks that the memory is divided into. Typically, one data signal and its complement are output from each memory bank. In the reset state of the memory device, these signals are typically charged to a power supply Vcc. Depending upon the value of the data being read (1 or 0) and the bank being accessed, one of these signals is driven to Vgnd. The MUX latch 100 determines which input has discharged to Vgnd and holds the appropriate logic state even after all inputs have returned to Vcc.

The MUX latch 100 has a four-input pairs (dat0 to dat3 and dat0_b to dat3_b) MUX 110. The MUX latch 100 also has a latch 120 having two inverters 121 and 123, which are embedded inside the MUX 110. The latch 120 stores the previously read data value when the inputs are reset. When one of the input signals to the MUX 110 falls, either node d0 or node d1 is pulled up to Vcc and this value is stored in the latch 120. The MUX latch 100 further includes a five-input NAND gate 130 driven by the signal at node d0 and the signals dat0 through dat3. The NAND gate 130 causes the output signal qout 150 to begin switching before the nodes d0 and d1 reach their final values. This helps to prevent the set time of the latch 120 from being added to the propagation delay through the MUX latch 100.

However, the conventional MUX latch 100 in FIG. 1 suffers from some disadvantages as well. Typically, the five-input NAND gate 130 has a stack of five n-type Metal Oxide Semiconductor (nMOS) devices in its pull down path. This path is hence highly resistive and also has capacitive loading in its four intermediate nodes. If the nMOS devices are sized up to reduce path resistance, then gate capacitance of the nMOS devices increases and hence, node d0 is loaded by the extra gate capacitance. Also, in the worst case, a single p-type Metal Oxide Semiconductor (pMOS) transistor of the NAND gate 130 has to pull up the four intermediate nodes of its pull down path up to Vcc. This parasitic capacitance turns out to be significant and in order to get substantially equal rise and fall delays, the pMOS transistor size in the NAND gate 130 has to be made about 1.1× the size of the nMOS device instead of the expected 0.4×(2/5) factor. This further increases the capacitance of node d0, leading to more delay in the output transition of the MUX latch 100.

BRIEF DESCRIPTION OF THE DRAWINGS

The present invention will be understood more fully from the detailed description that follows and from the accompanying drawings, which however, should not be taken to limit the appended claims to the specific embodiments shown, but are for explanation and understanding only.

DETAILED DESCRIPTION

In the following description, numerous specific details are set forth. However, it is understood that embodiments of the invention may be practiced without these specific details. In other instances, well-known circuits, structures, and techniques have not been shown in detail in order not to obscure the understanding of this description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly couple and to indirectly couple through one or more intervening components.

Figure 2:
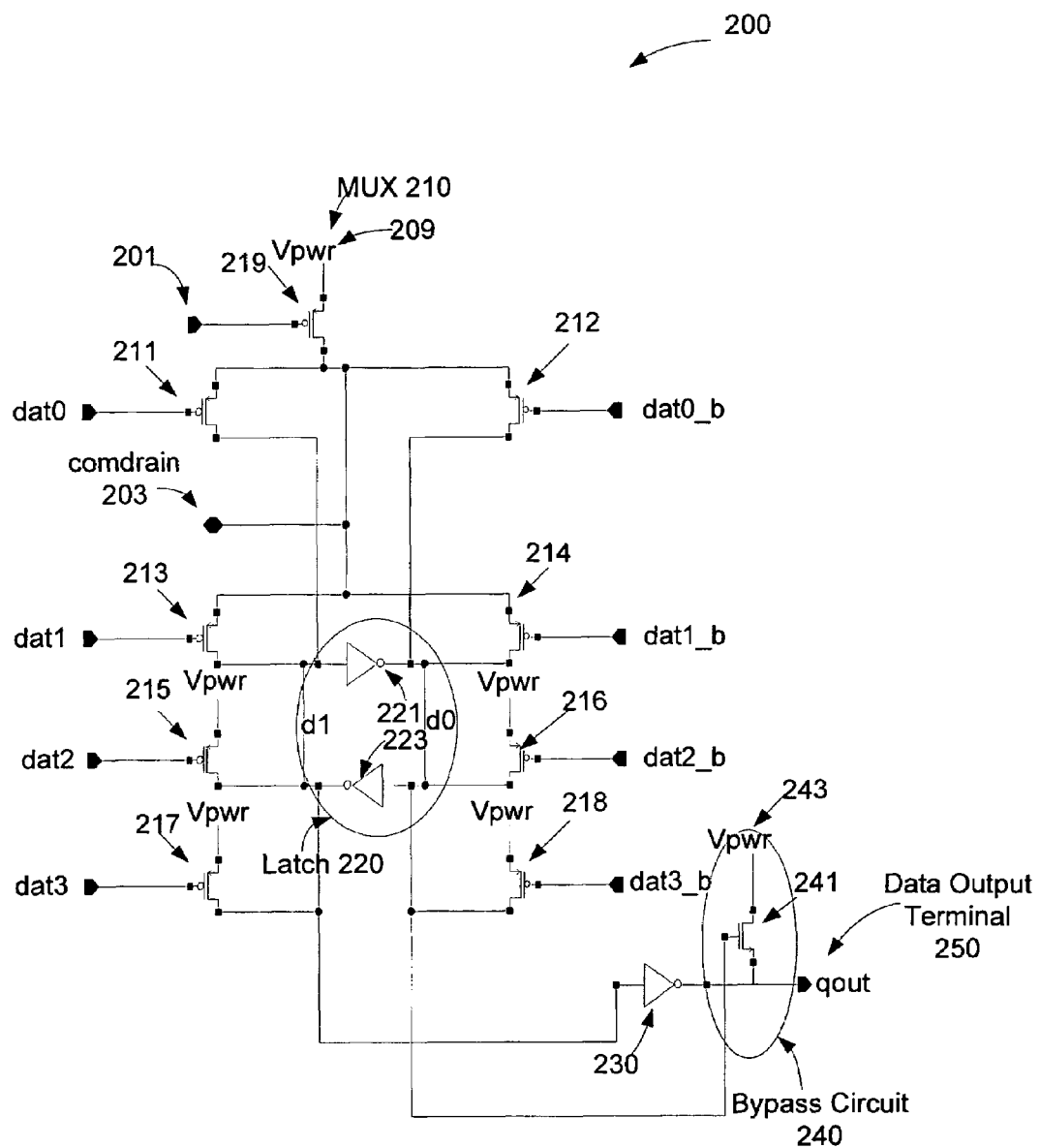
FIG. 2 shows one embodiment of a multiplexer latch.

FIG. 2 shows one embodiment of a multiplexer (MUX) latch. The MUX latch 200 includes a MUX 210, a latch 220, an inverter 230, and a bypass circuit 240. The latch 220 is embedded within the MUX 210 such that they are coupled to each other at nodes d0 and d1. The input of the inverter 230 is also coupled to the latch 220 at node d1 and the output of the inverter 230 is coupled to a data output terminal 250 and the bypass circuit 240. The bypass circuit 240 is further coupled to the latch 220 at node d0 and the data output terminal 250.

The MUX 210 may include a number of p-type field effect transistors (pFETs) 211–219. The pFET 219 of the MUX 210 has a source coupled to a power supply Vpwr 209 and a gate coupled to an enable signal 201. The drain of the pFET 219 is coupled to the signal comdrain 203 and the sources of the pFETs 211, 212, 213, and 214. To enable the MUX 210, the enable signal 201 goes low to activate the pFET 219, which in turns pull the sources of the pFETs 211–214 high.

The drains of the pFETs 211 and 212 are coupled to nodes d1 and d0, respectively, and also to the drains of the pFETs 213 and 214, respectively. The drains of the pFETs 215 and 216 are coupled to nodes d1 and d0, respectively, and to the drains of the pFETs 217 and 218, respectively. The gates of the pFETs 211 and 212 are driven by the dat0 and dat0_b signals respectively. The gates of the pFETs 213 and 214 are driven by dat1 and dat1_b signals respectively, and the gates of the pFETs 215 and 216 are driven by dat2 and dat2_b signals respectively. Likewise, the gates of the pFETs 217 and 218 are driven by dat3 and dat3_b signals, respectively. The sources of the pFETs 215, 216, 217, and 218 are coupled to a power supply Vpwr.

In some embodiments, the MUX latch 200 is used in a memory to output data from the memory. The memory includes a number of memory banks and two of the pFETs 211–218 are coupled to each memory bank of the memory to receive a data signal and its complement from the memory bank. For example, the memory may have four memory banks, namely, memory banks 0–3. The pFETs 211 and 212 are coupled to memory bank 0 to receive dat0 and its complement, dat0_b from memory bank 0. The pFETs 213 and 214 are coupled to memory bank 1 to receive dat1 and dat1_b from memory bank 1. The pFETs 215 and 216 are coupled to memory bank 2 to receive dat2 and dat2_b from memory bank 2. Likewise, the pFETs 217 and 218 are coupled to memory bank 3 to receive dat3 and dat3_b from memory bank 3.

Referring back to FIG. 2, the latch 220 includes a first inverter 221 and a second inverter 223. The inverters 221 and 223 are in a cross-coupled configuration such that an output of the inverter 221 is coupled to an input of the inverter 223 at node d0. Likewise, an output of the inverter 223 is coupled to an input of the inverter 221 at node d1. As described above, the latch 220 is coupled to the input of the inverter 230 at node d1 and the bypass circuit 240 at node d0. The output of the inverter 230 is coupled to the data output terminal 250 and the bypass circuit 240.

In some embodiments, the bypass circuit 240 includes an n-type field effect transistor (nFET) 241. The nFET 241 includes a drain, a gate, and a source. The drain of the nFET 241 is coupled to a power supply Vpwr 243. The source of the nFET 241 is coupled to the data output terminal 250 and the output of the inverter 230. The gate of the nFET 241 is coupled to the latch 220 at node d0.

In one embodiment, when one of the signals, dat0–dat3 and dat0_b–dat3_b switches, node d1 is pulled high. The inverter 230 then pulls the voltage at the data output terminal 250 low. At about the same time, the latch 220 stores the data at node d1. So the delay for the falling edge of the output signal qout at the data output terminal 250 is about the same as a sum of the delay to charge up node d1 plus the delay through the inverter 230.

In order to reduce the delay of the rising edge of the signal qout at the data output terminal 250, the bypass circuit 240 is used to pre-charge the data output terminal 250. When any one of the dat0_b–dat3_b signals switches, node d0 is pulled up and this activates the nFET 241 in the bypass circuit 240, which in turn begins to charge the data output terminal 250 substantially immediately. At about the same time, the voltage at node d1 falls, causing the output of the inverter 230 to rise. The output of the inverter 230 then pulls the signal qout to substantially the same level as the power supply Vpwr 243. By pre-charging the data output terminal 250 via the bypass circuit 240, the rising edge transition at the data output terminal 250 becomes faster, thus reducing the rise delay of the output signal qout.

In addition, the size of the nFET 241 may be optimized to allow the signal qout to rise faster. For example, the nFET 241 may have a size of 10×1.5 in some embodiments.

Furthermore, inverters 221 and 223 of the latch 220 are skewed in some embodiments to aid the falling transition of the signal at node d1. As the signal at node d1 falls faster, the output of inverter 230 rises faster, and hence, the rising edge transition at the data output terminal 250 becomes faster as well. In some embodiments, inverters 221 and 223 are skewed such that the p/n ratio of inverter 221 is 0.28:0.56 while the p/n ratio of inverter 223 is 0.28:1.12.

Figure 1:
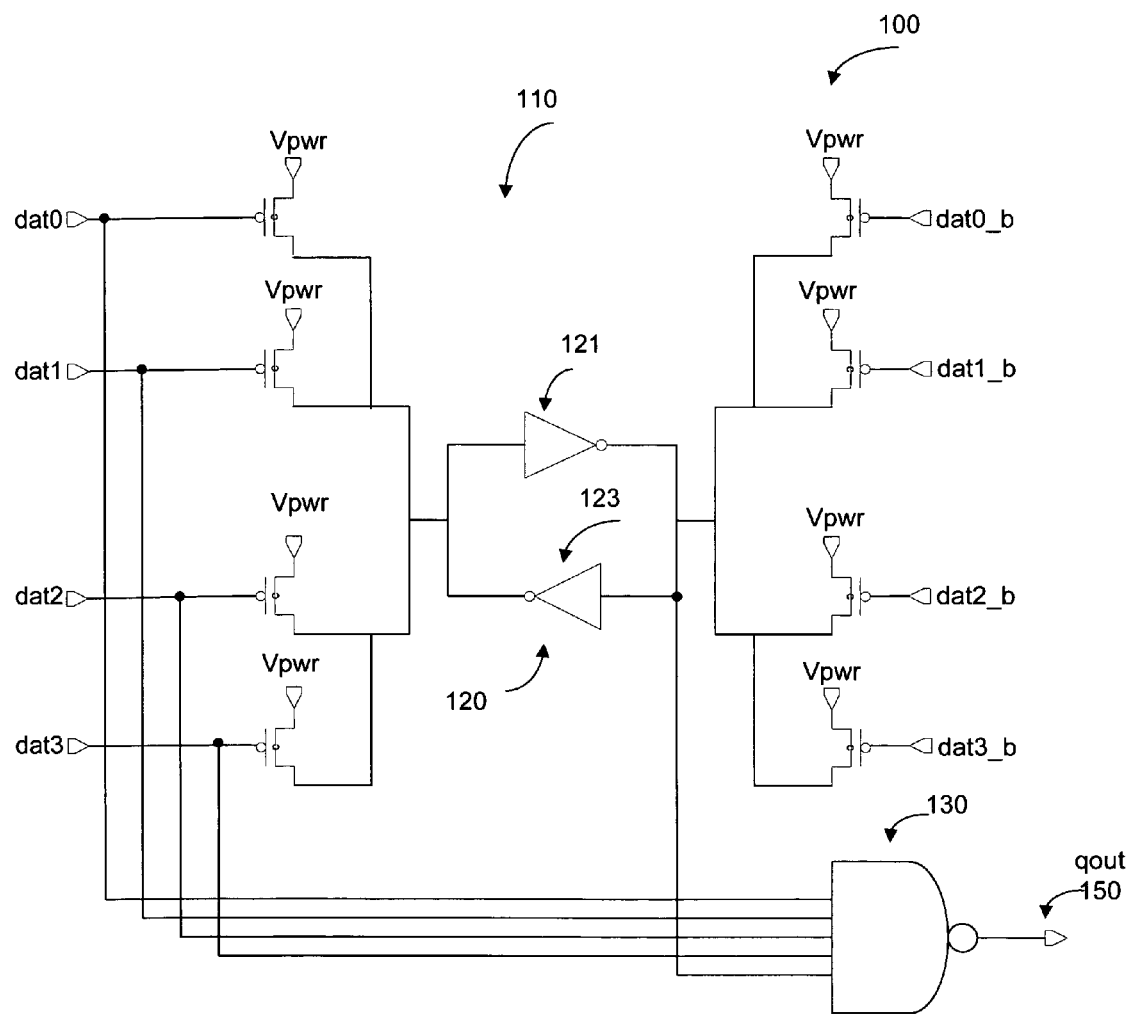
FIG. 1 shows a conventional multiplexer latch.

Techniques described above (e.g., the optimization of the size of the nFET 241, the use of the inverter 230, the skewing of the latch 220, etc.) contribute to achieving substantially equal output rise and fall delays of the MUX latch 200. One embodiment of the multiplexer latch 200 has been simulated and the delay has been found to be about 65% lower than the conventional MUX latch 100 shown in FIG. 1 across some predetermined process corners.

In addition to reducing output switching delay, skewing the inverters 221 and 223 and replacing the five-input NAND gate 130 with the inverter 230 also help to reduce capacitive loading at nodes d0 and d1. These changes may also reduce pull-down and pull-up resistance at the data output terminal 250 to increase output edge rate.

Figure 3:
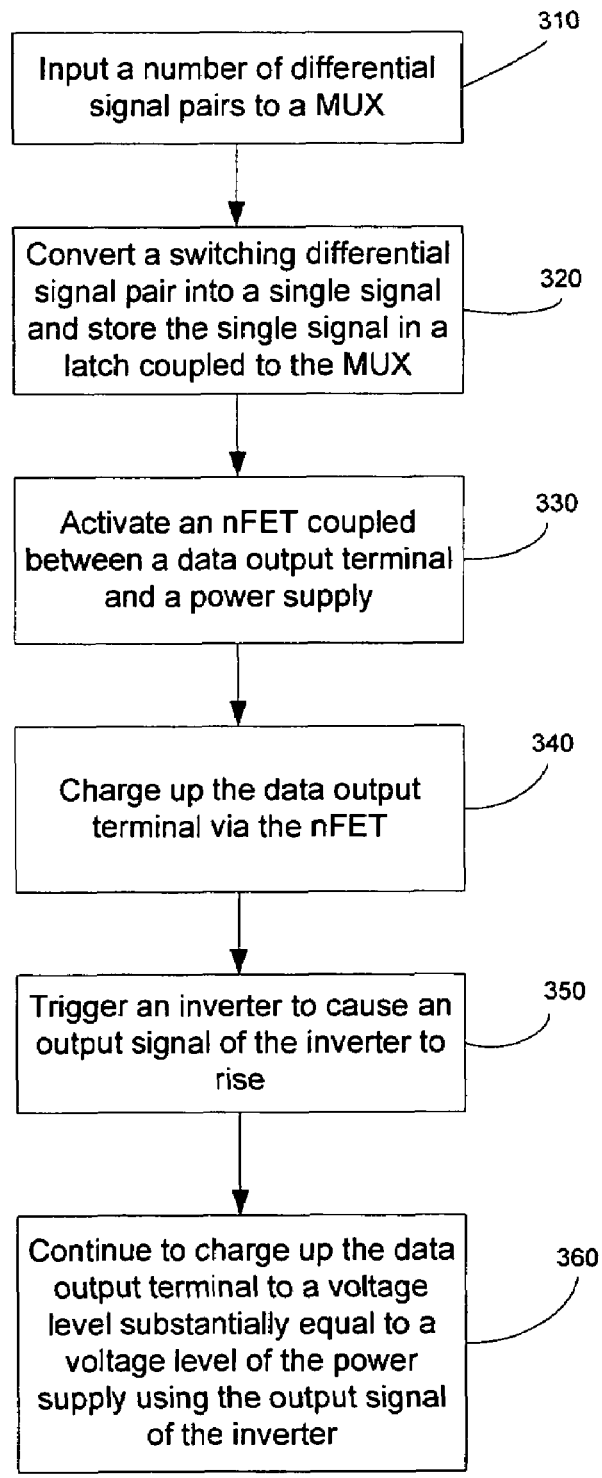
FIG. 3 shows one embodiment of a process to latch and output data.

FIG. 3 shows one embodiment of a process to latch and output data. The process is performed by processing logic that may comprise hardware (e.g., circuitry, dedicated logic, etc.), software (such as is run on a general-purpose computer system, a server, or a dedicated machine), or a combination of both.

In one embodiment, processing logic inputs a number of differential signal pairs to a MUX (processing block 310). When one of the differential signal pairs switches, processing logic selects the switching differential signal pair and converts the switching differential signal pair into a single output signal to be output at a data output terminal. To do so, processing logic may store the single output signal in a latch coupled to the MUX (processing block 320). Processing logic then activates an nFET coupled between the latch, the data output terminal, and a power supply (processing logic 330). The activated nFET charges up the data output terminal (processing block 340).

However, due to the threshold voltage (Vt) of the nFET, the nFET may not charge the data output terminal all the way up to about the power supply level. Thus, processing logic may use an inverter coupled between the latch and the data output terminal to charge the data output terminal all the way up to about the power supply level. In one embodiment, processing logic triggers the inverter coupled between the latch and the data output terminal to cause an output signal of the inverter to rise (processing block 350). Using the output signal of the inverter, processing logic continues to charge up the data output terminal to a voltage level substantially equal to the voltage level of the power supply (processing block 360).

Figure 4:
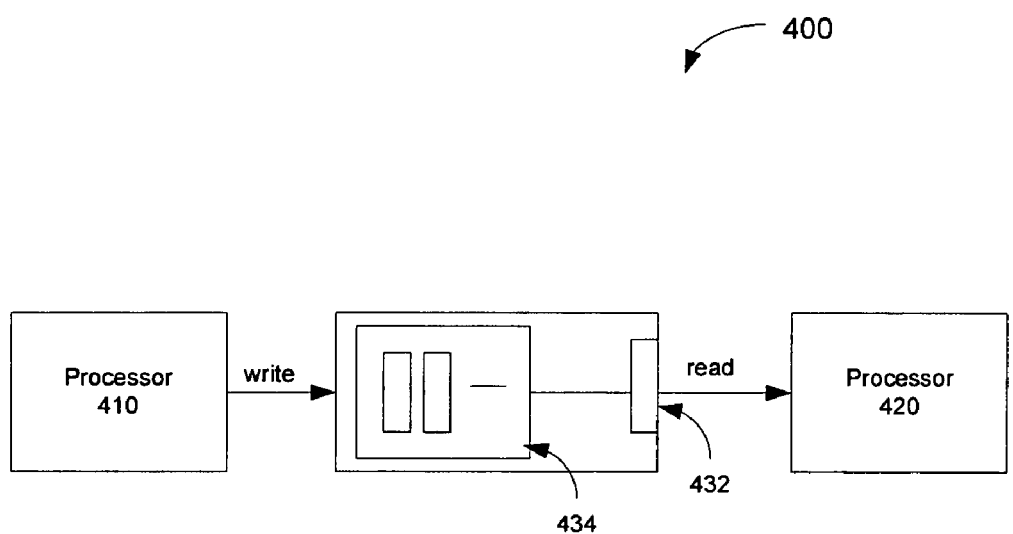
FIG. 4 shows an exemplary embodiment of a system usable with some embodiments of the invention.

FIG. 4 illustrates one embodiment of a computing system 400 usable with some embodiments of the invention. The computing system 400 includes two processors 410 and 420 and a memory 430. The memory 430 is coupled between the processors 410 and 420. Thus, the memory 430 may be referred to as a dual-port memory. In some embodiments, the memory 430 is synchronous memory. Alternatively, the memory 430 is asynchronous memory.

The memory 430 includes a number of memory banks 434 and an input/output (I/O) interface 432. In some embodiments, the memory 430 allows processor 410 to write data into the memory 430 while the processor 420 is reading data out of the memory 430. Data in the memory banks 434 may be output to the processor 420 via the I/O interface 432. In some embodiments, the I/O interface 432 includes a data output terminal and a MUX latch. The MUX latch is operable to convert a differential signal pair from one of the memory banks 434 within the memory 430 into a single signal to be output via the data output terminal. Furthermore, the MUX latch is also operable to hold the signal between cycles so that the memory 430 can be disabled to save power. Details of some embodiments of the MUX latch have been described above.

Note that any or all of the components of the system 400 and associated hardware may be used in various embodiments of the present invention. However, it can be appreciated that other configurations of the system 400 may include additional or fewer components than those illustrated in FIG. 4.

Furthermore, the system 400 described above is merely intended as an example to illustrate one application of the MUX latch. It should be appreciated that the MUX latch described above is applicable to other integrated circuits and/or systems, such as those using differential data busses and pre-charge logic (e.g., single-port memory, content addressable memory, programmable logic device, etc.).

The foregoing discussion merely describes some exemplary embodiments of the present invention. One skilled in the art will readily recognize from such discussion, the accompanying drawings, and the claims that various modifications can be made without departing from the spirit and scope of the appended claims. The description is thus to be regarded as illustrative instead of limiting.

What is claimed is:

1. An apparatus, comprising:
   a multiplexer (MUX);
   a latch coupled to the MUX at a first node and a second node;
   an inverter having an input and an output, the input coupled to the latch at the second node and the output coupled to a data output terminal; and
   a bypass circuit coupled to the latch at the first node and the data output terminal.

2. The apparatus of claim 1, wherein the bypass circuit comprises:
   an n-type field effect transistor (nFET) having a gate, a drain, and a source, the gate coupled to the first node, the drain coupled to a power supply, and the source coupled to the data output terminal.

3. The apparatus of claim 1, wherein the latch comprises:
   a first inverter having an input and an output, the input of the first inverter coupled to the second node and the output of the first inverter coupled to the first node; and
   a second inverter having an input and an output, the input of the second inverter coupled to the first node and the output of the second inverter coupled to the second node.

4. The apparatus of claim 3, wherein the second inverter is skewed such that the second inverter pulls down faster than the second inverter pulls up relative to the first inverter.

5. The apparatus of claim 1, wherein the MUX comprises:
   a first plurality of p-type field effect transistors (pFETs) driven by a first plurality of data signals; and
   a second plurality of pFETs driven by a second plurality of data signals complement to the first plurality of data signals.

6. The apparatus of claim 5, wherein each of the first plurality of pFETs comprises a drain coupled to the second node and each of the second plurality of pFETs comprises a drain coupled to the first node.

7. A memory comprising the apparatus of claim 1, wherein the memory further comprises:
   a plurality of memory banks coupled to the MUX; and
   a first input/output (I/O) port comprising the MUX, the latch, the inverter, the bypass circuit, and the data output terminal.

8. The memory of claim 7, wherein the memory is a synchronous memory.

9. The memory of claim 7, wherein the memory is an asynchronous memory.

10. A system comprising the memory of claim 7, the system further comprising:
    a first processor coupled to the data output terminal of the first I/O port of the memory to receive data from the plurality of memory banks via the first I/O port.

11. The system of claim 10, further comprising:
    a second processor, wherein the memory further comprises a second I/O port to couple the plurality of memory banks to the second processor.

12. A method, comprising:
    converting a plurality of differential signal pairs into a single output signal to be output at a data output terminal, wherein converting the plurality of differential signal pairs comprises
      inputting the plurality of differential signal pairs to a multiplexer (MUX), and
      storing the single output signal in a latch coupled to the MUX;
    reducing delay in a transition of the single output signal at the data output terminal, comprising skewing the latch to reduce delay in the transition of the single output signal at the data output terminal, wherein the latch comprises a first and a second inverters and skewing the latch comprises sizing the first inverter of the latch to pull up faster than the first inverter pulls down relative to the second inverter; and
    outputting the single output signal from the latch via the data output terminal coupled to the latch and the MUX.

13. A method, comprising:
    converting a plurality of differential signal pairs into a single output signal to be output at a data output terminal;
    reducing delay in a transition of the single output signal at the data output terminal, comprising charging up the data output terminal via a bypass circuit when one of the plurality of differential signal pairs switches, wherein charging up the data output terminal via the bypass circuit comprises activating an n-type field effect transistor (nFET) coupled between the data output terminal and a power supply;
    triggering a third inverter to cause an output signal of the third inverter to rise, the output of the third inverter being coupled to the data output terminal; and
    continuing to charge up the data output terminal to a voltage level substantially equal to a voltage level of the power supply using the output signal of the third inverter.

14. An apparatus, comprising:
    means for converting a plurality of differential signal pairs into a single output signal to be output at a data output terminal;
    means for reducing delay in a transition of the single output signal at the data output terminal;
    means for storing the single output signal; and
    means for reducing capacitive loading in the means for storing the single output signal.

* * * * *